United States Patent
Suzuki

(10) Patent No.: US 9,846,343 B2
(45) Date of Patent: Dec. 19, 2017

(54) DISPLAY DEVICE AND DISPLAY CONTROL METHOD

(71) Applicant: BOE TECHNOLOGY GROUP CO., LTD., Beijing (CN)

(72) Inventor: Teruaki Suzuki, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 97 days.

(21) Appl. No.: 14/362,118

(22) PCT Filed: Dec. 16, 2013

(86) PCT No.: PCT/CN2013/089524
§ 371 (c)(1),
(2) Date: May 30, 2014

(87) PCT Pub. No.: WO2015/021718
PCT Pub. Date: Feb. 19, 2015

(65) Prior Publication Data
US 2015/0049268 A1    Feb. 19, 2015

(30) Foreign Application Priority Data
Aug. 14, 2013 (CN) .......................... 2013 1 0353680

(51) Int. Cl.
| | | |
|---|---|---|
| *G02F 1/137* | (2006.01) | |
| *G02F 1/13* | (2006.01) | |
| *G02F 1/1335* | (2006.01) | |
| *G02B 27/28* | (2006.01) | |
| *H01L 51/52* | (2006.01) | |

(52) U.S. Cl.
CPC ....... *G02F 1/13725* (2013.01); *G02B 27/281* (2013.01); *G02B 27/288* (2013.01);
(Continued)

(58) Field of Classification Search
CPC .................................................. G02F 1/13725
See application file for complete search history.

(56) References Cited

U.S. PATENT DOCUMENTS

| 2002/0145687 A1 | 10/2002 | Mitsui et al. | |
|---|---|---|---|
| 2003/0038912 A1* | 2/2003 | Broer | C09K 19/00 349/122 |

(Continued)

FOREIGN PATENT DOCUMENTS

| CN | 1175048 A | 3/1998 |
|---|---|---|
| CN | 1368656 A | 9/2002 |

(Continued)

OTHER PUBLICATIONS

PCT Notification of Transmittal of the International Search Report and the Written Opinion of the International Searching Authority, or the Declaration for counterpart PCT Application No. PCT/CN2013/089524, 26 pp. (including English translation), (dated Jul. 8, 2014).

(Continued)

*Primary Examiner* — Edmond Lau
(74) *Attorney, Agent, or Firm* — Blakely, Sokoloff, Taylor & Zafman LLP

(57) ABSTRACT

The present invention provides a display device and a display control method of the display device, so as to improve transmittance of the light emitted from the display device itself in an indoor environment. A display device provided by the present invention includes a display panel and a quarter-wave layer disposed at a light outgoing side of the display panel, the display device further includes: a liquid crystal structure disposed at a side of the quarter-wave layer away from the display panel, the liquid crystal structure presenting a polarization state or a transparent state under different ambient light intensity conditions.

19 Claims, 2 Drawing Sheets

(52) U.S. Cl.
CPC ...... *G02F 1/1313* (2013.01); *G02F 1/133502* (2013.01); *H01L 51/5281* (2013.01); *G02F 2203/62* (2013.01)

(56) References Cited

U.S. PATENT DOCUMENTS

| | | | | |
|---|---|---|---|---|
| 2004/0245902 | A1* | 12/2004 | Li | G09G 3/3208 |
| | | | | 313/112 |
| 2007/0058109 | A1* | 3/2007 | Nieuwkerk | A47G 1/02 |
| | | | | 349/96 |
| 2010/0002296 | A1 | 1/2010 | Choi et al. | |
| 2013/0242212 | A1* | 9/2013 | Huang | H01L 51/5271 |
| | | | | 349/15 |

FOREIGN PATENT DOCUMENTS

| | | |
|---|---|---|
| CN | 1655376 A | 8/2005 |
| CN | 1967358 A | 5/2007 |
| CN | 101208623 A | 6/2008 |
| CN | 101777289 A | 7/2010 |
| CN | 102411225 A | 4/2012 |
| CN | 102646696 A | 8/2012 |
| CN | 103033868 A | 4/2013 |
| CN | 103441139 A | 12/2013 |
| CN | 203376536 U | 1/2014 |
| WO | WO 2008/011222 A2 | 1/2008 |
| WO | WO 2010/028728 A1 | 3/2010 |

OTHER PUBLICATIONS

First Office Action for corresponding Chinese Patent Application No. 201310353680.0, 17 pp. (including English translation), (dated May 28, 2015).

PCT International Preliminary Report on Patentability for counterpart PCT Application No. PCT/CN2013/089524, 7 pp. (Feb. 16, 2016).

* cited by examiner

DISPLAY DEVICE AND DISPLAY CONTROL METHOD

CROSS-REFERENCE TO RELATED APPLICATIONS

This patent application is a US. National Phase Application under 35 U.S.C. §371 of International Application No. PCT/CN2013/089524, filed Dec. 16, 2013, entitled DISPLAY DEVICE AND DISPLAY CONTROL METHOD, which claims priority to Chinese Patent Application No. 201310353680.0, filed Aug. 14, 2013.

FIELD OF THE INVENTION

The present invention relates to the field of display technology, and particularly, to a display device and a display control method of the display device.

DESCRIPTION OF THE RELATED ART

At present, mainstream display techniques include Cathode Ray Tube (CRT) display technique, Liquid Crystal Display (LED) technique, Plasma Display Panel (PDP) technique, Filed Emission Display (FED) technique, Electronic Luminescent Display (ELD) technique, and Organic Light-Emitting Diode (OLED) display technique. Each of the foregoing techniques has its pros and cons, and it is therefore necessary to adopt different display techniques according to different requirements in specific applications.

OLED display technique is taken as an example below. OLED display technique uses a glass substrate and a very thin coating of organic material which emits light in response to an electric current. Compared to LED display technique, no backlight (also referred to as backlight module) is required, and accordingly, an OLED display device has a smaller thickness, a lighter weight, and a wider viewing angle, and is more energy-saving. However, in an outdoor environment where light is bright, the OLED display device has an obviously reduced display effect. To overcome the influence caused by the ambient light, an OLED display device has been proposed in the prior art. As shown in FIG. 1, intense ambient light is eliminated by sequentially forming a quarter-wave layer 20 and a polarizing layer 30 on a display panel 10, which is an OLED display panel. The specific operating principle is as follows: ambient light 40 becomes linearly polarized light after passing through the polarizing layer 30, and the linearly polarized light then becomes right-handed or left-handed circularly polarized light after passing through the quarter-wave layer 20, that is, the quarter-wave layer 20 and the polarizing layer 30 are combined to form a right-handed or left-handed circularly polarized plate, which converts nature light into right-handed or left-handed circularly polarized light. The right-handed or left-handed circularly polarized light becomes left-handed or right-handed circularly polarized light after reflected by the display panel 10, and then after passing through the quarter-wave layer 20, becomes linearly polarized light whose polarization direction, compared to the linearly polarized light formed by the ambient light 40 after passing through the polarizing layer 30, is rotated by 90°, exactly in the direction of the absorption axis of the polarizing layer 30, such that light is absorbed and cannot pass through the polarizing layer 30 to be seen by human eyes, thus achieving the function of eliminating ambient light 40.

However, as shown in FIG. 2, display light 50 emitted from the display panel 10 is not polarized, and is still not polarized after passing through the quarter-wave layer 20, whereas nearly a half of the display light 50 is absorbed by the polarizing layer 30 when passing through the polarizing layer 30, which, combined with the influence of scattering and reflection, greatly decreases the transmittance of the light emitted from the display panel 10. Especially in an indoor environment, the transmittance of the light emitted from OLED 10 tends to be rather low.

To obtain a proper brightness, an approach is to increase pixel current, which, however, will result in increased power consumption. Alternatively, another technique may be used, in which a photochromic material which exhibits dichroism is adopted for the polarizing layer 30, that is, the polarizing layer 30 presents a polarization state with ambient light and presents a transparent state without ambient light, such that the problem of low transmittance of the light emitted from the display panel 10 is solved. However, such photochromic material which exhibits dichroism is relatively expensive, has a complicated production process, and is not suitable for practical applications.

SUMMARY OF THE INVENTION

Embodiments of the present invention provide a display device and a display control method of the display device, so as to improve transmittance of the light emitted from the display device itself in an indoor environment.

A display device provided by an embodiment of the present invention includes a display panel and a quarter-wave layer disposed at a light outgoing side of the display panel, the display device further includes:

a liquid crystal structure disposed at a side of the quarter-wave layer away from the display panel, the liquid crystal structure presenting a polarization state or a transparent state under different ambient light intensity conditions.

Further, the liquid crystal structure includes:

a first transparent substrate and a second transparent substrate provided face to face;

a first electrode disposed at a side of the first transparent substrate facing the second transparent substrate, and a second electrode disposed at a side of the second transparent substrate facing the first transparent substrate; and a liquid crystal material layer disposed between the first electrode and the second electrode.

Further, the liquid crystal material layer is made of a guest-host liquid crystal material.

Further, the guest-host liquid crystal material is a positive guest-host liquid crystal material, and the liquid crystal structure presents the polarization state when no voltage is applied between the first electrode and the second electrode, and presents the transparent state when a voltage is applied between the first electrode and the second electrode; or the guest-host liquid crystal material is a negative guest-host liquid crystal material, and the liquid crystal structure presents the polarization state when a voltage is applied between the first electrode and the second electrode, and presents the transparent state when no voltage is applied between the first electrode and the second electrode.

Further, the voltage applied between the first electrode and the second electrode is in a range of 3V to 20V.

Further, the first transparent substrate and the second transparent substrate are transparent glass substrates or plastic substrates.

Further, materials of the first electrode and the second electrode are transparent conductive materials.

Further, the materials of the first electrode and the second electrode are indium tin oxide, indium zinc oxide, silver nanowires paste, graphite, or organic conductive materials.

Further, the liquid crystal material layer has a thickness of 1 μm to 50 μm.

Further, the display device also includes a control unit, the control unit is used for:

controlling the liquid crystal structure to present the polarization state under a first triggering condition; and controlling the liquid crystal structure to present the transparent state under a second triggering condition, wherein the first triggering condition and the second triggering condition are pre-set according to intensity of ambient light, or set through a manual triggering by a user.

An embodiment of the present invention provides a display control method of the above-mentioned display device, comprising:

controlling the liquid crystal structure to present the polarization state under a first triggering condition; and controlling the liquid crystal structure to present the transparent state under a second triggering condition, wherein the first triggering condition and the second triggering condition are pre-set according to intensity of ambient light, or set through a manual triggering by a user.

The display devices provided by the present invention enable the liquid crystal structure to present the polarization or transparent state under different triggering conditions, such that the problem of low transmittance of the light emitted from the display device itself in an indoor environment is solved.

DETAILED DESCRIPTION OF THE PREFERRED EMBODIMENTS

The present invention will be described in detail below in combination with the accompanying figures and the preferred embodiments. It should be noted that the described embodiments are only illustrative but not used to limit the present invention.

Figure 1:
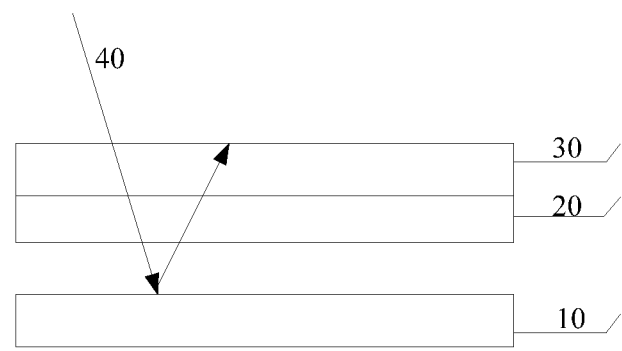
FIG. 1 is a schematic diagram of a structure of an OLED display device in the prior art.
Figure 2:
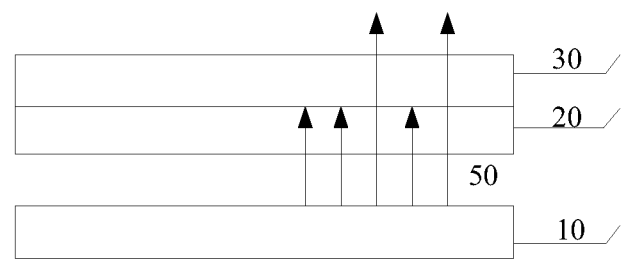
FIG. 2 is a schematic diagram illustrating light propagation in the structure shown in FIG. 1 under a condition without ambient light.
Figure 3:
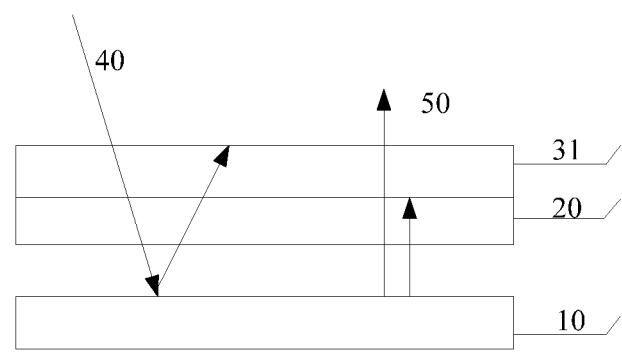
FIG. 3 is a schematic diagram of a structure of a display device provided by an embodiment of the present invention.

As shown in FIG. 3, the present embodiment provides a display device, comprising:

a display panel 10, a quarter-wave layer 20 located at a light outgoing side of the display panel 10, and a liquid crystal structure 31 disposed at a side of the quarter-wave layer 20 away from the display panel 10. The liquid crystal structure 31 presents a polarization state or a transparent state under different ambient light intensity conditions. Here, referring to FIG. 4, the liquid crystal structure 31 includes:

a first transparent substrate 311 and a second transparent substrate 312 which are provided face to face;

a first electrode 313 disposed at a side of the first transparent substrate 311 facing the second transparent substrate 312, and a second electrode 314 disposed at a side of the second transparent substrate 312 facing the first transparent substrate 311; and a liquid crystal material layer 315 disposed between the first electrode 313 and the second electrode 314.

Here, the liquid crystal material layer 315 may be made of a guest-host liquid crystal material, which is composed of liquid crystal molecules and dichroic dye molecules. The dichroic dye molecules are organic dye molecules whose light-absorption capabilities in long axis and short axis directions are different, and may be classified into positive dichroic dye molecules and negative dichroic dye molecules. The positive dichroic dye molecules have a poorer light-absorption capability in the long axis direction than in the short axis direction, while the negative dichroic dye molecules have a stronger light-absorption capability in the long axis direction than in the short axis direction. The liquid crystal molecules themselves may also be classified into positive and negative liquid crystal molecules, and form a positive or negative guest-host liquid crystal material after combined with the dichroic dye molecules. As the guest-host liquid crystal material belongs to the prior art, it will not be elaborated herein. The guest-host liquid crystal material adopted in this embodiment includes liquid crystal molecules 3150 and dye molecules 3151.

Figure 4:
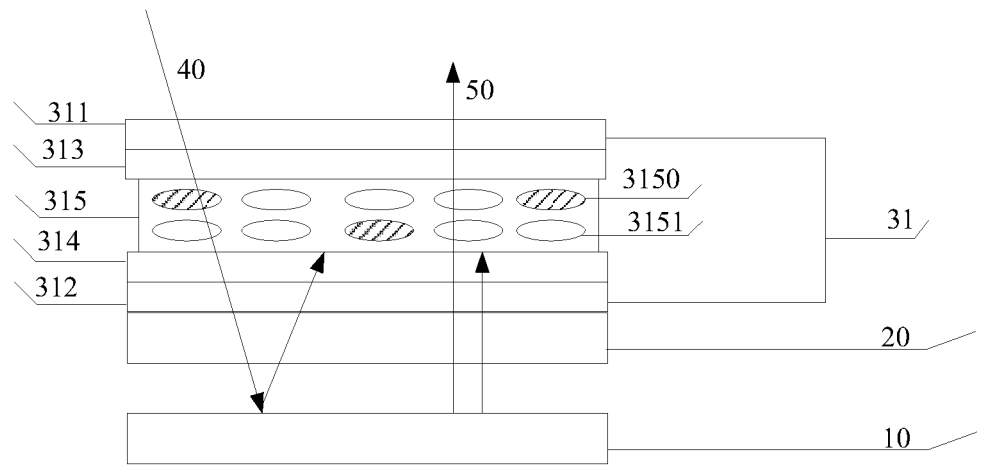
FIG. 4 is a schematic diagram illustrating a structure of a display device, in which the liquid crystal structure is in a polarization state, provided by an embodiment of the present invention.

As shown in FIG. 4, if the guest-host liquid crystal material is positive, when no voltage is applied between the first electrode 313 and the second electrode 314, both the liquid crystal molecules 3150 and the dye molecules 3151 of the guest-host liquid crystal material are horizontally oriented, which causes the liquid crystal structure 31 to present a polarization state. Alternatively, if the guest-host liquid crystal material is negative, when a voltage is applied between the first electrode 313 and the second electrode 314, both the liquid crystal molecules 3150 and the dye molecules 3151 of the guest-host liquid crystal material are horizontally oriented, which also causes the liquid crystal structure 31 to present a polarization state. Under a condition of ambient light, the liquid crystal structure 31 is controlled to present a polarization state, which may eliminate the influence of ambient light, and improve the contrast.

Figure 5:
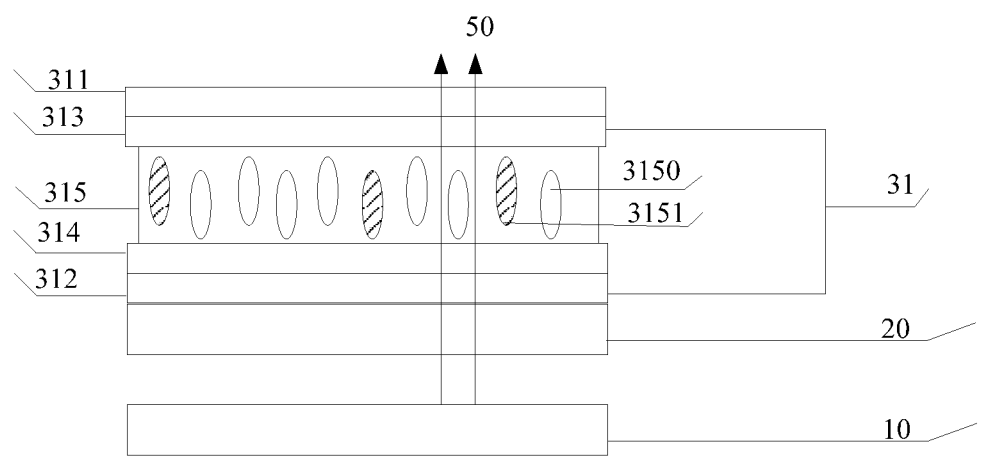
FIG. 5 is a schematic diagram illustrating that a structure of a display device, in which the liquid crystal structure is in a transparent state, provided by an embodiment of the present invention.

As shown in FIG. 5, if the guest-host liquid crystal material is negative, when a voltage is applied between the first electrode 313 and the second electrode 314, both the liquid crystal molecules 3150 and the dye molecules 3151 of the guest-host liquid crystal material are vertically oriented, which causes the liquid crystal structure 31 to present a transparent state. Alternatively, if the guest-host liquid crystal material is positive, when no voltage is applied between the first electrode 313 and the second electrode 314, both the liquid crystal molecules 3150 and the dye molecules 3151 of the guest-host liquid crystal material are vertically oriented, which also causes the liquid crystal structure 31 to present a transparent state. Under a condition without ambient light, the liquid crystal structure 31 is controlled to present a transparent state, which may increase the transmittance of the light emitted from the display panel itself.

It should be noted that different guest-host liquid crystal materials may be selected according to specific requirements. In a specific implementing process, the applied voltage is generally in a range of 3V to 20V, and magnitude of the applied voltage in a specific case is set according to factors such as properties of the actually adopted liquid crystal material and the like, which is not limited in the present invention.

Preferably, the liquid crystal material layer 315 has a thickness between 1 μm and 50 μm. Generally, the liquid crystal material with a larger thickness has a higher contrast, a decreased transmittance, and a slower response, and therefore, the liquid crystal material layer 315 in this embodiment preferably has a thickness between 1 μm and 50 μm. For the first and second transparent substrates 311 and 312, transparent glass or plastic may be adopted in a specific implementing process. A transparent conductive material is preferably used for the first and second electrodes 313 and 314. In a specific implementing process, the materials of the first and second electrodes 313 and 314 may be, but not limited to, indium tin oxide, indium zinc oxide, silver nanowires paste, graphite, or organic conductive materials, and may also be other transparent conductive materials suitable for the present invention.

Specifically, an OLED display panel is now taken as an example. Under a condition of ambient light, referring to FIG. 4, the display panel 10 emits display light 50, which sequentially passes through the quarter-wave layer 20 and liquid crystal structure 31, so as to achieve display function. Meanwhile, under the condition of ambient light, the liquid crystal structure 31 is controlled to present a polarization state, and ambient light 40 becomes linearly polarized light after passing through the liquid crystal structure 31, which then becomes right-handed or left-handed circularly polarized light after passing through the quarter-wave layer 20. That is, the quarter-wave layer 20 and the liquid crystal structure 31 are combined to form a right-handed or left-handed circularly polarized plate, which converts nature light into right-handed or left-handed circularly polarized light. The right-handed or left-handed circularly polarized light becomes left-handed or right-handed circularly polarized light after reflected by the display panel 10, and then after passing through the quarter-wave layer 20, becomes linearly polarized light whose polarization direction, compared to the linearly polarized light formed by the ambient light 40 after passing through the liquid crystal structure 31, is rotated by 90°, exactly in the direction of the absorption axis of the liquid crystal structure 31, such that light is absorbed and cannot pass through the liquid crystal structure 31 to be seen by human eyes, thus achieving the effect of eliminating ambient light 40.

In a condition without ambient light, referring to the diagram shown in FIG. 5, the display panel 10 emits display light 50, which sequentially passes through the quarter-wave layer 20 and liquid crystal structure 31, so as to achieve display function. Meanwhile, under the condition without ambient light, the liquid crystal structure 31 is controlled to present a transparent state, and therefore, the display light 50 may not be absorbed overmuch due to polarization direction when passing through the liquid crystal structure 31, thus improving the transmittance of the light emitted from the display panel itself in an indoor environment.

Moreover, the display device provided by this embodiment may further include a control unit (not shown in figures), which is used for controlling the state (transparent state or polarization state) presented by the liquid crystal structure 31. For example, under a first triggering condition, the control unit controls the liquid crystal structure 31 to present the polarization state; while under a second triggering condition, the control unit controls the liquid crystal structure 31 to present the transparent state. Here, the first and second triggering conditions may be pre-set according to the intensity of ambient light, or be set by manual triggering of a user. The specific settings on the first and second triggering conditions will be described in detail below.

For the above display device, the embodiment also provides a display control method of the above display device, comprising:

controlling the liquid crystal structure to present the polarization state under the first triggering condition; and controlling the liquid crystal structure to present the transparent state under the second triggering condition.

Here, the first triggering condition and the second triggering condition are pre-set according to the intensity of ambient light, or set by manual triggering of a user.

The control method will be described below by taking a case that the display device is an OLED display device as an example. It should be noted that the display device is not limited to the OLED display device, and may also be a liquid crystal display device that needs backlight or a display device that may use the present inventive concept.

The OLED display device includes an OLED display panel, a quarter-wave layer disposed at a light outgoing side of the OLED display panel, and a liquid crystal structure disposed at a side of the quarter-wave layer away from the OLED display panel. Here, the liquid crystal structure includes: a first transparent substrate and a second transparent substrate which are provided face to face, a first electrode disposed at a side of the first transparent substrate facing the second transparent substrate, a second electrode disposed at a side of the second transparent substrate facing the first transparent substrate, and a liquid crystal material layer disposed between the first electrode and the second electrode. As the OLED display panel in the embodiment may be an OLED display panel in the prior art, and therefore is not elaborated herein. It should also be noted that this specific embodiment is only used to better explain the present invention, but not to limit the present invention.

In a specific implementing process, the OLED display device may be connected to a sensor which automatically senses ambient light, and control the liquid crystal structure to present a polarization state under a first triggering condition, and control the liquid crystal structure to present a transparent state under a second triggering condition. Specifically, the first triggering condition includes a condition that the intensity of the ambient light sensed by the sensor is larger than or equal to a certain threshold, for example, the sensed light intensity is larger than or equal to 1000 Lux. In this case, a control may be performed on voltage or current so that no voltage is applied between the first electrode and the second electrode, which causes the liquid crystal structure to present the polarization state, and further eliminates the influence of ambient light. The second triggering condition includes a condition that the intensity of the ambient light sensed by the sensor is smaller than a certain threshold, for example, the sensed light intensity is smaller than 1000 Lux. In this case, accordingly, a control may be performed on voltage or current so that a voltage is applied between the first electrode and the second electrode, which causes the liquid crystal structure to present the transparent state, and further improves the transmittance of the light emitted from the OLED display panel itself.

It should be noted that the sensor which automatically senses ambient light belongs to the prior art, and therefore is not elaborated herein.

Alternatively, the first and second triggering condition may be set through a manual triggering by a user according to the intensity of ambient light. For example, when ambient light is considered to be too bright, the first triggering condition may be set through a manual triggering by the user. Here, the manual triggering may be in a form of press key or touch screen, or the like, and in this case a control may be performed on voltage or current so that no voltage is applied between the first electrode and the second electrode, which causes the liquid crystal structure to present the polarization state, and further eliminates the influence of ambient light. When ambient light is considered to have no influence on the display of the OLED display panel, the second triggering condition may be set through a manual triggering by the user. Accordingly, the manual triggering may also be in a form of press key or touch screen, or the like, and in this case a control may be performed on voltage or current so that a voltage is applied between the first electrode and the second electrode, which causes the liquid crystal structure to present the transparent state, and further improves the transmittance of the light emitted from the OLED display panel itself. It should be noted that the manual triggering technique using a press key or touch screen belongs to the prior art, and is not elaborated herein.

In summary, the display device and the display control method of the display device provided by the embodiments of the present invention enable the liquid crystal structure to present a polarization or transparent state under different triggering conditions, such that the problem of low transmittance of the light emitted from the display panel itself in an indoor environment is solved.

The person skilled in the art should understand that the embodiments of the present invention may be provided as a method, a system or a computer program product. Therefore, the present invention may adopt a form of full hardware implementation, full software implementation or implementation combining hardware and software. Further, the present invention may adopt a form of computer program product which may be implemented in one or more computer-usable storage media (including but not limited to disk memory, optical memory and the like) in which computer-usable program codes are included.

Obviously, the person skilled in the art may make various amendments and variations without departing from the spirit and scope of the present invention. As such, if these amendments and variations fall into the scope of the claims of the present invention and their equivalents, the present invention intends to cover these amendments and variations.

What is claimed is:

1. A display device, comprising
   a display panel;
   a quarter-wave layer disposed at a light outgoing side of the display panel; and
   a liquid crystal structure disposed at a side of the quarter-wave layer away from the display panel, the liquid crystal structure presenting a polarization state or a transparent state under different ambient light intensity conditions,
   wherein the liquid crystal structure presents only the polarization state at a first ambient light intensity condition and presents only the transparent state under a second ambient light intensity condition, wherein intensity of ambient light under the first ambient light intensity condition is greater than or equal to a certain threshold, and the intensity of ambient light under the second ambient light intensity condition is smaller than the certain threshold.

2. The display device of claim 1, wherein the liquid crystal structure comprises:
   a first transparent substrate and a second transparent substrate provided face to face;
   a first electrode disposed at a side of the first transparent substrate facing the second transparent substrate, and a second electrode disposed at a side of the second transparent substrate facing the first transparent substrate; and
   a liquid crystal material layer disposed between the first electrode and the second electrode.

3. The display device of claim 2, wherein the liquid crystal material layer is made of a guest-host liquid crystal material.

4. The display device of claim 3, wherein
   the guest-host liquid crystal material is a positive guest-host liquid crystal material, and the liquid crystal structure presents the polarization state when no voltage is applied between the first electrode and the second electrode, and presents the transparent state when a voltage is applied between the first electrode and the second electrode; or
   the guest-host liquid crystal material is a negative guest-host liquid crystal material, and the liquid crystal structure presents the polarization state when a voltage is applied between the first electrode and the second electrode, and presents the transparent state when no voltage is applied between the first electrode and the second electrode.

5. The display device of claim 4, wherein the voltage applied between the first electrode and the second electrode is in a range of 3V to 20V.

6. The display device of claim 2, wherein the first transparent substrate and the second transparent substrate are transparent glass substrates or plastic substrates.

7. The display device of claim 2, wherein materials of the first electrode and the second electrode are transparent conductive materials.

8. The display device of claim 7, wherein the materials of the first electrode and the second electrode are indium tin oxide, indium zinc oxide, silver nanowires paste, graphite, or organic conductive materials.

9. The display device of claim 2, wherein the liquid crystal material layer has a thickness of 1 μm to 50 μm.

10. The display device of claim 1, further comprising a control unit, which is used for:
    controlling the liquid crystal structure to present the polarization state under a first triggering condition; and
    controlling the liquid crystal structure to present the transparent state under a second triggering condition,
    wherein the first triggering condition and the second triggering condition are pre-set according to the intensity of ambient light, or set through a manual triggering by a user according to the intensity of ambient light, wherein the intensity of ambient light under the first triggering condition is larger than or equal to the certain threshold, and the intensity of ambient light under the second triggering condition is smaller than the certain threshold.

11. The display device of claim 2, further comprising a control unit, which is used for:
    controlling the liquid crystal structure to present the polarization state under a first triggering condition; and
    controlling the liquid crystal structure to present the transparent state under a second triggering condition,
    wherein the first triggering condition and the second triggering condition are pre-set according to the intensity of ambient light, or set through a manual triggering by a user according to the intensity of ambient light, and wherein the intensity of ambient light under the first triggering condition is larger than or equal to the certain threshold, and the intensity of ambient light under the second triggering condition is smaller than the certain threshold.

12. The display device of claim 3, further comprising a control unit, which is used for:
controlling the liquid crystal structure to present the polarization state under a first triggering condition; and
controlling the liquid crystal structure to present the transparent state under a second triggering condition,
wherein the first triggering condition and the second triggering condition are pre-set according to the intensity of ambient light, or set through a manual triggering by a user according to the intensity of ambient light, and wherein the intensity of ambient light under the first triggering condition is larger than or equal to the certain threshold, and the intensity of ambient light under the second triggering condition is smaller than the certain threshold.

13. The display device of claim 4, further comprising a control unit, which is used for:
controlling the liquid crystal structure to present the polarization state under a first triggering condition; and
controlling the liquid crystal structure to present the transparent state under a second triggering condition,
wherein the first triggering condition and the second triggering condition are pre-set according to the intensity of ambient light, or set through a manual triggering by a user according to the intensity of ambient light, and wherein when the intensity of ambient light under the first triggering condition is larger than or equal to the certain threshold, and the intensity of ambient light under the second triggering condition is smaller than the certain threshold.

14. The display device of claim 5, further comprising a control unit, which is used for:
controlling the liquid crystal structure to present the polarization state under a first triggering condition; and
controlling the liquid crystal structure to present the transparent state under a second triggering condition,
wherein the first triggering condition and the second triggering condition are pre-set according to the intensity of ambient light, or set through a manual triggering by a user according to the intensity of ambient light, and wherein the intensity of ambient light under the first triggering condition is larger than or equal to the certain threshold, and the intensity of ambient light under the second triggering condition is smaller than the certain threshold.

15. The display device of claim 6, further comprising a control unit, which is used for:
controlling the liquid crystal structure to present the polarization state under a first triggering condition; and
controlling the liquid crystal structure to present the transparent state under a second triggering condition,
wherein the first triggering condition and the second triggering condition are pre-set according to the intensity of ambient light, or set through a manual triggering by a user according to the intensity of ambient light, and wherein the intensity of ambient light under the first triggering condition is larger than or equal to the certain threshold, and the intensity of ambient light under the second triggering condition is smaller than the certain threshold.

16. The display device of claim 7, further comprising a control unit, which is used for:
controlling the liquid crystal structure to present the polarization state under a first triggering condition; and
controlling the liquid crystal structure to present the transparent state under a second triggering condition,
wherein the first triggering condition and the second triggering condition are pre-set according to the intensity of ambient light, or set through a manual triggering by a user according to the intensity of ambient light, and wherein the intensity of ambient light under the first triggering condition is larger than or equal to the certain threshold, and the intensity of ambient light under the second triggering condition is smaller than the certain threshold.

17. The display device of claim 8, further comprising a control unit, which is used for:
controlling the liquid crystal structure to present the polarization state under a first triggering condition; and
controlling the liquid crystal structure to present the transparent state under a second triggering condition,
wherein the first triggering condition and the second triggering condition are pre-set according to the intensity of ambient light, or set through a manual triggering by a user according to the intensity of ambient light, and wherein the intensity of ambient light under the first triggering condition is larger than or equal to the certain threshold, and the intensity of ambient light under the second triggering condition is smaller than the certain threshold.

18. The display device of claim 9, further comprising a control unit, which is used for:
controlling the liquid crystal structure to present the polarization state under a first triggering condition; and
controlling the liquid crystal structure to present the transparent state under a second triggering condition,
wherein the first triggering condition and the second triggering condition are pre-set according to the intensity of ambient light, or set through a manual triggering by a user according to the intensity of ambient light, and wherein the intensity of ambient light under the first triggering condition is larger than or equal to the certain threshold, and the intensity of ambient light under the second triggering condition is smaller than the certain threshold.

19. A display control method of a display device, comprising
a display panel;
a quarter-wave layer disposed at a light outgoing side of the display panel; and
a liquid crystal structure disposed at a side of the quarter-wave layer away from the display panel, the liquid crystal structure presenting a polarization state or a transparent state under different ambient light intensity conditions, comprising:
controlling the liquid crystal structure to present the polarization state under a first triggering condition; and
controlling the liquid crystal structure to present the transparent state under a second triggering condition,
wherein the first triggering condition and the second triggering condition are pre-set according to intensity of ambient light, or set through a manual triggering by a user according to intensity of ambient light, and wherein when the intensity of ambient light is larger than or equal to a certain threshold, the first triggering condition is set, and when the intensity of ambient light is smaller than the certain threshold, the second triggering condition is set.

* * * * *